United States Patent [19]
Chen

[11] Patent Number: 5,896,314
[45] Date of Patent: Apr. 20, 1999

[54] ASYMMETRIC FLASH EEPROM WITH A POCKET TO FOCUS ELECTRON INJECTION AND A MANUFACTURING METHOD THEREFOR

[75] Inventor: Chia-Shing Chen, Hsing Chu, Taiwan

[73] Assignee: Macronix International Co., Ltd., Hsinchu, Taiwan

[21] Appl. No.: 08/812,104

[22] Filed: Mar. 5, 1997

[51] Int. Cl.$^6$ .................................................. G11C 13/00
[52] U.S. Cl. ................................. 365/185.01; 365/185.1
[58] Field of Search ........................ 365/185.01, 185.1, 365/185.05, 185.11

[56] References Cited

U.S. PATENT DOCUMENTS 5,452,250  9/1995  Riggio, Jr. ..................... 365/185.01

*Primary Examiner*—Terrell W Fears
*Attorney, Agent, or Firm*—Wilson, Sonsini, Goodrich & Rosati; Mark A. Haynes; Charles C. Cary

[57] ABSTRACT

A memory cell having an asymmetric source and drain connection to virtual ground bit-lines. A main diffusion, adjacent the drain and displaced from the source, allows Fowler-Nordheim (FN) tunneling erasure on the drain side of the floating gate. A pocket diffusion, between the main diffusion and the source, concentrates the electric field and thereby enhances the efficiency of programming by electron injection on the source side of the floating gate. A nonvolatile semiconductor memory device comprising row and column arrangement of the cells, in which adjacent columns of cells share a single virtual ground bit line. The method for manufacturing a memory cell having asymmetric source and drain regions and comprising the steps of: (1) forming a semiconductor substrate having a first conductivity type; (2) forming a dielectric covering a semiconductor substrate; (3) forming a first and second column of floating pates on the dielectric; (4) implanting a first dopant along a first dopant strip, the first dopant strip aligned adjacent the first column and displaced from the second column and having a second conductivity type opposite the first conductivity type; (5) implanting a second dopant in a second dopant strip, aligned with the first dopant strip and extending below the second column, the second dopant having an enhancement of the first conductivity type; and (6) completing formation of control gate dielectric and control gates. The manufacturing method of the present invention results in a cell, which increases floating gate memory array density and programming speed while reducing power consumption and the likelihood of a disturb condition.

5 Claims, 8 Drawing Sheets

ASYMMETRIC FLASH EEPROM WITH A POCKET TO FOCUS ELECTRON INJECTION AND A MANUFACTURING METHOD THEREFOR

RELATED APPLICATION DATA

This present application is related to Asymmetric Virtual Ground P-channel Flash Cell with Latid N-type Pocket And Method of Fabrication Therefor, Ser. No. 08/812,107, Attorney Docket No. 17538.861, filed on Mar. 5, 1997, which is incorporated by reference as if fully set forth herein.

BACKGROUND OF THE INVENTION

1. Field of the Invention

The field of the present invention relates to a nonvolatile semiconductor memory device and a manufacturing method therefor, and more particularly to an electrically programmable nonvolatile metal-oxide-semiconductor (MOS) memory device having an asymmetric source and drain and a manufacturing method therefor.

2. Description of Related Art

Flash memories are a growing class of nonvolatile storage integrated circuits. Flash memories have the capability of electrically erasing, programming, and reading a memory cell in the chip. A flash memory cell is formed using so-called floating gate transistors in which the data is stored in a cell by charging or discharging the floating gate. The floating gates are a conductive material, typically polysilicon, which is insulated from the channel of the transistor by a thin layer of oxide, or other insulating material. The floating gates are also insulated from the control-gate/word-line of the transistor by a second layer of insulating material.

Data is stored in the memory cell by charging or discharging the floating gate. The floating gate is discharged by tunneling of electrons through a thin dielectric separating the floating gate from the substrate. Fowler-Nordheim (FN) tunneling of electrons occurs when a large potential difference is established between the floating gate and either the source or drain. The resultant high electric field imparts sufficient potential energy to electrons to allow them to surmount the energy barrier presented by the thin dielectric and to tunnel through the dielectric. The direction of tunneling is determined by the polarity of the potential difference. While the only mechanism for removing electrons from the floating gate is by FN tunneling, there are several mechanisms for placing electrons on the floating gate. One is FN tunneling and the other is injection. Injection is typically a faster programming mechanism than FN tunneling. Injection relies on an electric field of lesser magnitude than that required for FN tunneling but requires some mechanism for imparting additional kinetic energy to electrons, which when coupled with the potential energy, is sufficient to allow electrons to surmount the energy barrier created by the thin dielectric. Typically, a large cross-channel current is required and a small fraction of the electrons become sufficiently energized by carrier-to-carrier collisions to inject through the dielectric.

When the floating gate is charged, the threshold voltage for causing the memory cell channel to conduct is increased above the voltage applied to the word-line during a read operation. Thus, when a charged cell is addressed during a read operation, the cell does not conduct. The non-conducting state of the cell can be interpreted as a binary 1 or 0 depending on the polarity of the sensing circuitry.

A trend in the industry to improve the packing density of a memory array, is to utilize a virtual ground architecture. In a virtual ground architecture, the transistors of adjacent memory cell columns share a bit-line between the source and the drain of the transistors in adjacent columns. The need for a dedicated pair of bit-lines per column is eliminated. Any memory cell in the array can be programmed, or read by the application of appropriate voltages to the word-line and the bit-lines connected to it. In particular, the state of an addressed memory cell can be determined by sensing the current flowing through its source and drain by means of the bit-lines connected thereto.

A drawback to buried bit-line virtual ground architecture in flash memory is the problem of an undesired disturb/program of an adjacent cell which shares a bit-line and a word-line with a cell being programmed or read. During erasing of a cell, the adjacent cell may be susceptible to FN tunneling. This results in an unacceptable memory loss, often referred to as a "memory disturb," which will affect the readout characteristic of the cell.

A drawback to the use of the injection mechanism for programming a cell is that large amounts of power are required. Typically, only a fraction of a percent of the charge carriers crossing the channel obtain sufficient energy to be injected into the floating gate. The rest are wasted. Injection mechanisms are therefore difficult to implement in memory arrays which have low power specifications.

The major challenges to the effective implementation of flash memory design are memory disturb, programming speed, and power consumption. In order to realize further reductions in array size, what is needed is a solution to the disturb problem in virtual ground architectures. In order to realize further reductions in power consumption, what is also needed is a solution to the inefficiency of programming by electron injection.

SUMMARY OF THE INVENTION

The present invention provides a nonvolatile semiconductor memory device and a manufacturing method therefor. The memory device is constructed from memory cells comprising a single floating gate transistor. The transistor is designed with asymmetries which minimize power consumption and increase resistance to a disturb condition. The cell is programmed by Channel Hot Electron (CHE) or Source Side Injection (SSI) and erased by FN tunneling. The tunneling region and the injection region are on opposite sides of the transistor.

The transistor is suitable for use in a virtual ground memory architecture in which adjacent cells share a source and a drain with a single bit-line. A main diffusion which forms the bit-line is asymmetrically placed, adjacent the drain and displaced from the source. This allows FN tunneling erasure on the drain and minimizes the disturb problem on the source side of the floating gate.

The memory cell is designed for efficient programming by electron injection. A pocket diffusion, between the main diffusion and the source, concentrates the electric field on the source side of the floating gate. This enhances the efficiency of programming by electron injection, reduces power consumption, and minimizes the degradation of the thin tunneling dielectric on the drain side of the floating gate.

In order to achieve the foregoing memory device, a semiconductor substrate of a first conductivity type is provided. A dielectric is provided on the semiconductor substrate. A floating gate is provided on the dielectric. The floating gate has opposing first and second sides. A first diffusion region is disposed horizontally with respect to the first side of the floating gate. The first diffusion region is characterized by a second conductivity type. A second diffusion region is aligned horizontally between the first diffusion and the first side of the floating gate. The second diffusion region is characterized by the first conductivity type, and is doped so as to be more conductive than the substrate. A third diffusion region is aligned horizontally with the second side of the floating gate. The third diffusion region has the second conductivity type.

In another embodiment of the invention, an array of memory cells are laid out as rows and as a first and second column on a dielectric covering a semiconductor substrate of a first conductivity type. Each memory cell comprises a single floating gate transistor. A plurality of virtual ground bit-lines are buried in the substrate, such that each bit-line links a respective adjacent column of memory cells in a memory array. Each of the plurality of bit-lines is formed from a plurality of first and second diffusion regions buried in the substrate beneath the dielectric. The plurality of first diffusion regions are aligned on one side with the first column and are displaced on the other side from the second column. The plurality of first diffusion regions are characterized by a second conductivity type opposite the first conductivity type. A plurality of second diffusion regions in the semiconductor substrate are aligned with a corresponding one of the plurality of first diffusion regions and extend horizontally below the second column of floating gates. The plurality of second diffusion regions have the first conductivity type and are more conductive than the semiconductor substrate. Each floating gate of a memory cell has a gate of polycrystalline silicon joined with the gate of an adjacent transistor in a row to form a word-line. The word-line is arranged in a direction perpendicular to the buried diffusion layers. The word-line conductor is separated from the floating gates by a dielectric layer. A row select circuit is connected to the plurality of word-lines. A column select circuit and sense amplifier are connected to the plurality of first and second diffusion regions. The selection circuitry gates current to a word-line and a selected pair of the plurality of first and second diffusion regions to program, erase, and read a selected floating gate transistor.

Further, a manufacturing method for the above-mentioned nonvolatile semiconductor memory device according to this, invention comprises the steps of:

forming a semiconductor substrate having a first conductivity type;

forming a dielectric covering the semiconductor substrate;

forming a first and a second column of floating gates on the dielectric;

implanting a first dopant having a second conductivity type opposite the first conductivity type along a first dopant strip, the first dopant strip aligned adjacent the first column and displaced from the second column;

implanting a second dopant in a second dopant strip, the second dopant strip aligned with the first dopant strip and extending, below the second column, the second dopant having the first conductivity type and having greater conductivity than the semiconductor substrate; and completing formation of control gate dielectric and control gates.

The manufacturing method of the present invention results in a cell which increases floating gate memory array density and programming speed while reducing power consumption and the likelihood of a disturb condition.

Other aspects and advantages of the present invention can be seen upon review of the figures, the detailed description, and the claims which follow.

DETAILED DESCRIPTION

A detailed description of the preferred embodiments of the present invention is provided with respect to the figures. A transistor having an asymmetric source and drain structure resulting from the asymmetric placement of a main and a pocket diffusion is disclosed. The transistor is programmed by an injection mechanism and erased by a tunneling mechanism. The tunneling region and the injection region are on opposite sides of the transistor, to prevent degradation of the thin tunneling oxide. The asymmetric layout of the main diffusion, adjacent the drain and displaced from the source, allows FN tunneling erasure on the drain side of the floating gate. The asymmetric layout of the pocket diffusion, between the main diffusion and the source, concentrates the electric field and thereby promotes programming by electron injection on the source side of the floating gate. The asymmetric layout of the transistor achieves the desired configuration of a virtual ground memory architecture in which adjacent cells share a source and a drain with a single bit-line. According to this aspect of the invention, the asymmetric transistor achieves an increase in floating gate memory array density and programming speed, while at the same time reducing the likelihood of a disturb condition.

Figure 1:
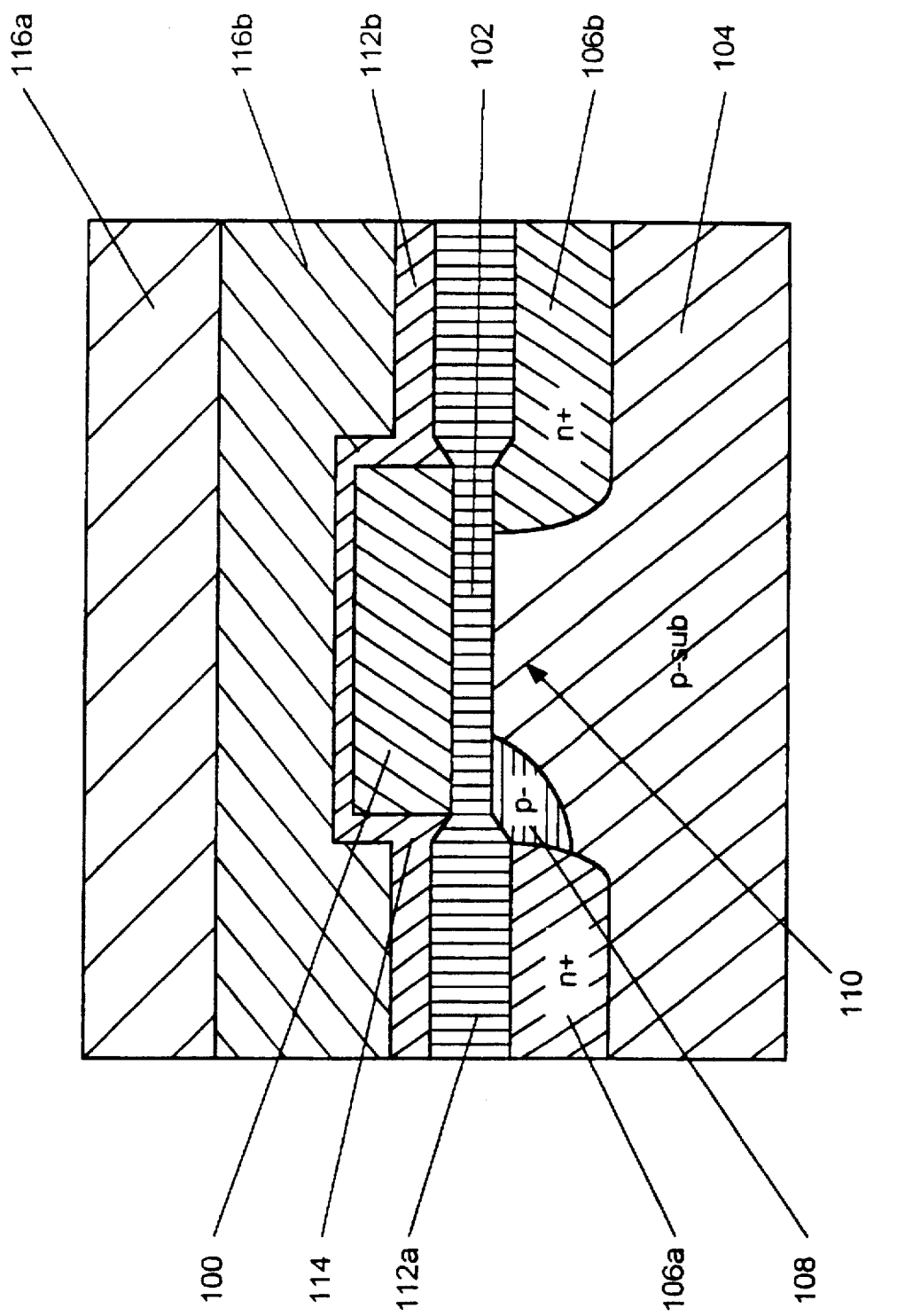
FIG. 1 is an elevation view of a first embodiment of an asymmetric floating gate memory cell.

FIG. 1 is a partial cross-section elevation view of a n-channel floating gate transistor. A floating gate 100 is separated from a p-type substrate 104 by a tunneling dielectric 102. A source junction is formed by buried $n^+$ source diffusion 106a and buried source $p^-$ pocket 108. The buried source $p^-$ pocket separates the $n^+$ source diffusion from the source side of the floating gate. On the drain side of the cell a buried $n^+$ drain diffusion underlaps the drain side of the transistor. A n-type channel region 110 is defined between the drain and source junctions. Naturally, this symmetry could be reversed so that the source would have an underlapping diffusion and the drain would have a displaced diffusion and a pocket. The buried source and drain diffusions 106a–b are covered by field oxide regions 112a–b, respectively. The field oxide regions and floating gate are separated from a control gate by an interpoly dielectric 114. The control gate is formed from a polysilicon layer 116b and a silicide layer 116a.

During F-N erasure of the transistor, a negative voltage, e.g., −9 volts, will be applied to the control gate 116a–b, a positive voltage, e.g., +6 volts, will be applied to drain 106b and the source 106a will be floating. Under these conditions, F-N tunneling of electrons from the floating gate 100 to the drain diffusion 106b, will take place.

The transistor may be programmed by either Channel Hot Electron injection (CEE) or Source Side Injection (SSI). To program by CHE injection a positive voltage, e.g. +12 volts, is applied to the control gate, a positive voltage is applied to the source, e.g. +5 volts, and the drain is grounded. Under these conditions, electrons are accelerated across the channel from the drain to the source and a sufficient number of them become energetic enough to inject though the dielectric 102 into the floating gate 100. To program by SSI injection a positive voltage, e.g. +12 volts, is applied to the control gate, a positive voltage is applied to the drain, e.g. +3 volts, and the source is grounded. Under these conditions electrons are accelerated across the channel from the source to the drain and a sufficient number of them become energetic enough to inject though the dielectric 102 into the floating gate 100. The efficiency of either injection mechanism is enhanced by the buried $p^-$ pocket 108. The pocket diffusion has the same conductivity type as the substrate, although at a higher dopant level. The pocket has several beneficial effects. When a positive programming voltage is applied to the control gate, an inversion layer is formed in the channel and the channel becomes conductive. Because of the enhanced dopant levels in the pocket, the pocket is weakly inverted, has fewer charge carriers, and a higher resistance than the channel. If the channel and the pocket are viewed as series resistances, the resistance across the pocket is higher than the resistance across the channel. Most of the source to drain voltage drop is across the pocket. This is true, whether the source is positive and the drain is grounded or vice-versa. As a result the electric field is concentrated in the pocket and the concentration of the electric field increases the probability for electron injection into the floating gate. In addition, the pocket becomes the probable location for the electron injection. This latter result is particularly important when the injection mechanism is SSI. In SSI, electrons are traveling from a source at ground to a drain at a positive voltage. In the absence of the pocket, the point of maximum electron injection would be at the drain. Electron injection at the drain would affect the tunneling characteristics of the drain oxide and degrade the erase characteristics of the device. The pocket therefore provides the additional benefit of refocusing the maximum electron injection point from the drain to the source during SSI injection.

The read operation is accomplished by applying a positive voltage, e.g. +5 volts, to the control gate, a positive voltage, e.g. +1.2 volts, to the source and with the drain at 0 volts. When the floating gate is charged, the threshold voltage for causing the n-channel transistor to conduct is increased above the voltage applied to the control gate during a read operation. Thus, a charged transistor will not conduct during a read operation and an uncharged transistor will conduct. The non-conducting state of the cell can be interpreted as a binary 1 or 0 depending on the polarity of the sensing circuitry.

Array Architectures

Figure 2:
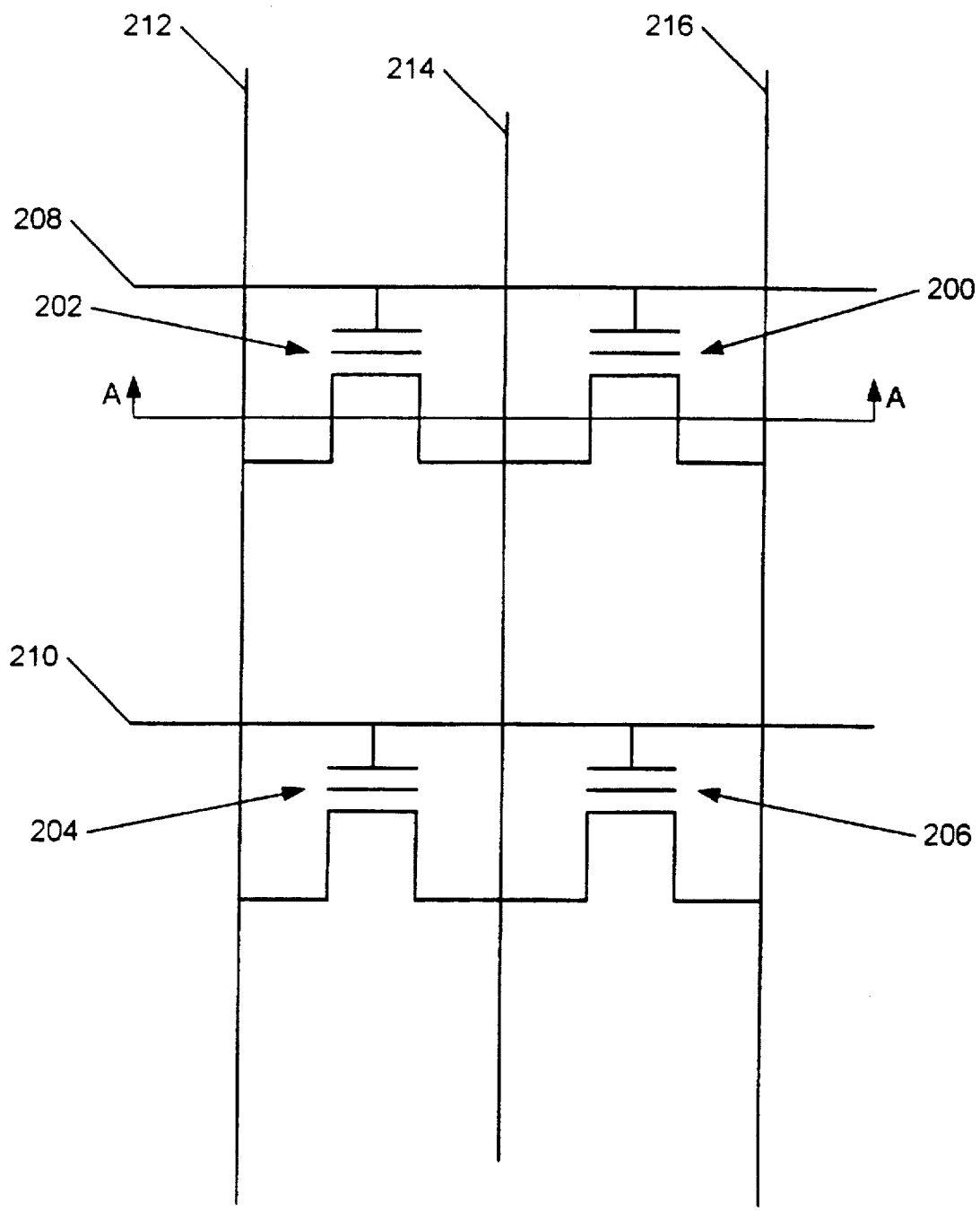
FIG. 2 is a circuit diagram of a memory array using the asymmetric floating gate memory cell in a virtual ground layout.

FIG. 2 is a schematic illustration of a memory array using the asymmetric transistor of the current invention. A two-dimensional array of memory cells is formed by arranging floating gate transistors 200, 202, 204, 206 into rows and columns. As depicted in FIG. 2, a right column comprises transistor 200 and transistor 206. A left column comprises transistor 202 and transistor 204. The first row of the array comprises transistor 202 and transistor 200. The second row of the array comprises transistor 204 and transistor 206. The gates of transistors 200 and 202 are connected to word-line 208. The gates of transistors 204 and 206 are connected to word-line 210.

In a virtual ground architecture, adjacent columns of memory cells share a bit-line with the sources of one and the drains of the other column of transistors. In the virtual ground architecture, the drains of transistors 202–204 and the sources of transistors 200 and 206, are connected to a buried diffusion bit-line 214. The sources of transistors 202 and 204, are connected to bit-line 212. The drains of transistors 200 and 206 are connected to bit-line 216.

An X-Y addressing system is affected by word-lines 208 and 210 and the rows of memory cells they select on an X-axis, and the bit-lines 212–216 and the columns of memory cells on a Y-axis. when a memory cell such as that formed from transistor 202 is addressed, appropriate voltages must be passed onto its control gate, source and drain by the word-line 208 and bit-lines 212–214. In this instance, any cell in the array can be addressed individually for programming, erasure and read operations.

The asymmetric transistor of the current invention is particularly advantageous in a memory array. It isolates and minimizes the disturb condition in a cell sharing a bit-line and a word-line with an adjacent cell that is being erased. As shown in FIG. 1, each asymmetric transistor is configured so that tunneling takes place only at the drain side, thereby preventing a disturb condition on a cell adjacent to one being erased. This cell structure may be used in a virtual ground architecture to reduce the disturb problem. In the virtual ground architecture, the disturb problem that arises that will be described in greater detail is called an erase disturb.

Erase Disturb

The terminology "erase disturb" refers to a decrease in floating gate charge and, therefore, possible corruption of the bit stored in memory, resulting from the erasing of an adjacent cell. When, for example, transistor 202 is to be erased, a negative voltage is placed on word-line 208. Bit-line 214 connected to the drain of transistor 202 and is placed at a positive voltage and bit-lines 212 and 216 are floating. Under these conditions, electrons are removed from the floating gate of transistor 202 to the bit-line 214. The control gate of transistor 202 and transistor 200 are both connected to word-line 208. Therefore, during the erasing of transistor 202 the control gate of transistor 200 is also placed in a negative voltage condition. In addition, the source of transistor 200 is connected to bit-line 214 and is therefore placed in a positive voltage condition. If the source of transistor 200 provides a favorable path for electron tunneling by a F-N mechanism then electrons will be removed from the floating gate of transistor 200 during the erasing of transistor 202. If sufficient charge is removed from the floating gate of transistor 200 to alter the logic state, due to an erase disturb condition, then an error occurs. However, due to the drain junction that maximizes electron tunneling and the source junction that minimizes electron tunneling, the present cell structure reduces the erase disturb problem.

Manufacturing Steps for an asymmetric Transistor

FIGS. 3–8 are cross-sectional views taken at FIG. 2(A—A) of a preferred embodiment for the manufacturing steps of an asymmetric transistor. The manufacturing techniques result in a cell that has an underlapping diffusion suitable for F-N erasure on one of the source or drain sides of the cell. On the other side of the cell, a $p^-$ pocket concentrates electric field to enhance electron injection during programming. The cell produced by this process has a high programming speed, lower power consumption and is resistant to a disturb condition.

Figure 3:
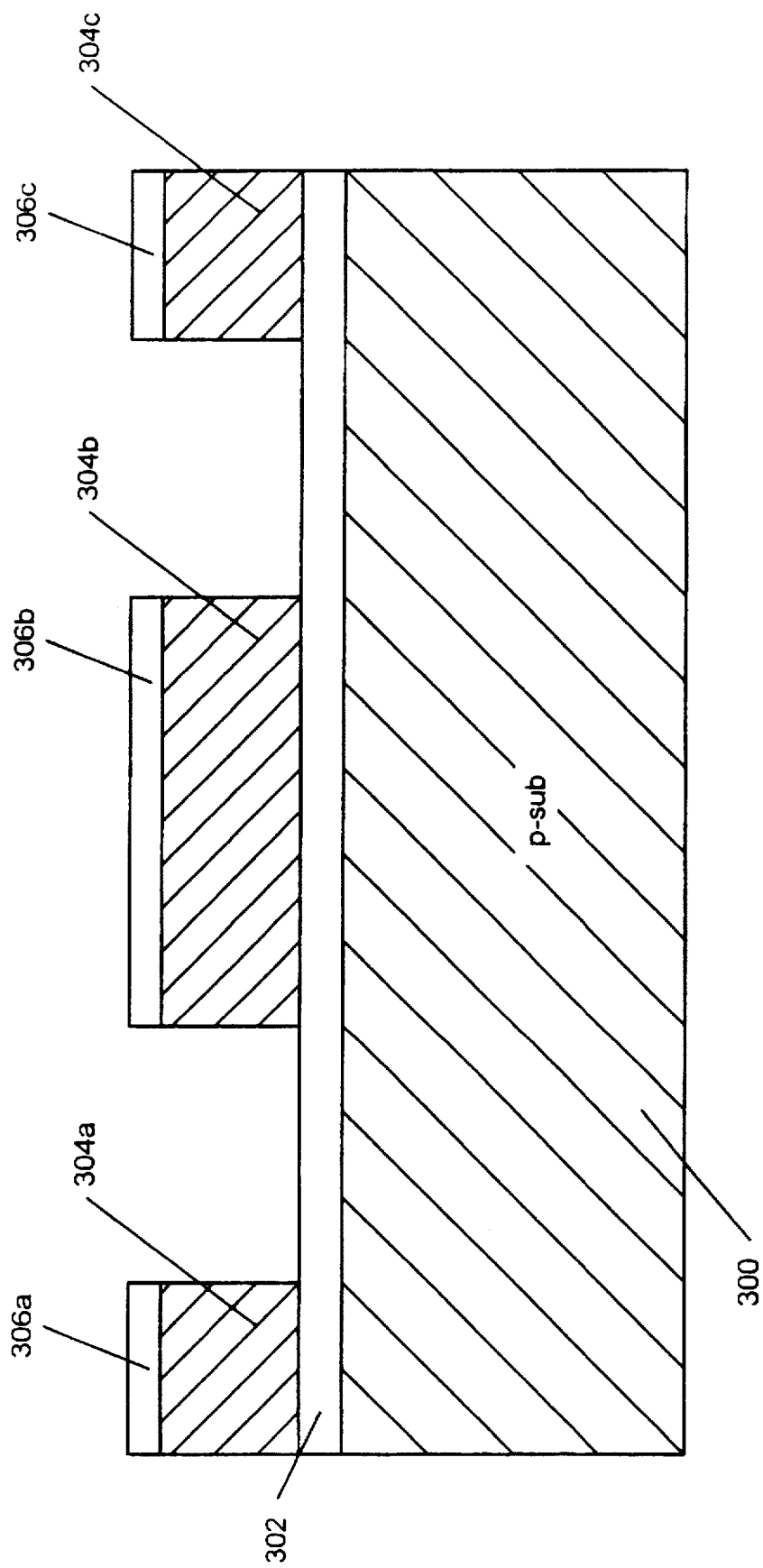
FIGS. 3–8 are cross-sectional elevation views taken at FIG. 2 (A—A) and illustrating the initial steps in the manufacture of asymmetric memory cells in a virtual ground architecture.

The cell is fabricated using a sub-micron CMOS double metal, double well (one well in the array, and a second well for the peripheral circuitry), double poly and one layer polycide technology. FIG. 3 illustrates the initial formation steps. A tunneling oxide 302 is formed on the surface of the p-type substrate 300. Next a polysilicon layer is deposited on the tunneling oxide. Then a silicon nitride layer is deposited on the polysilicon. The structure is masked and patterned to define polysilicon floating gate strips 304a–c and respective silicon nitride caps 306a–c.

Figure 4:
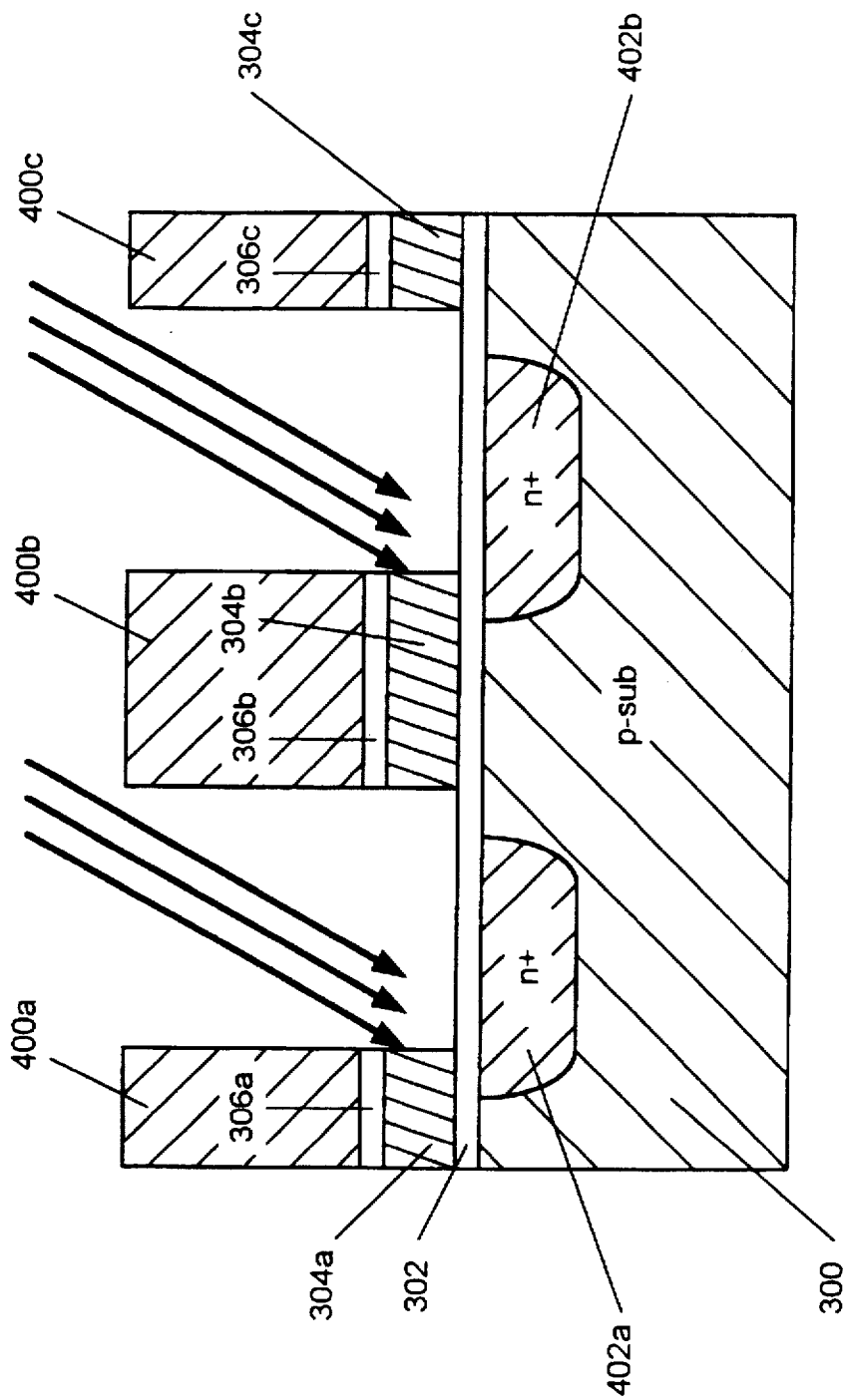

Then, as shown in FIG. 4, photo-resist masks 400a–c are placed over nitride caps 308a–d, respectively. Next an implant of an n-type dopant, e.g., arsenic is used to form buried $n^+$ diffusions 402a–b. The dopant level of $n^+$ is about $10^{20}$ atom per cm$^3$. The formation involves a Large Angle Tilt Implant Diffusion (LATID) ion implantation process. The LATID process allows precise targeting of the dopant location. The angle of an implant depends on device geometry and may range from 30 to 75 degrees of tilt. The angle of tilt is sufficient to cause shadowing on the source side of the floating gate strips 304a–c. As a result, the $n^+$ diffusions are displaced from the source side and adjacent the drain side of each of the floating gate strips.

Figure 5:
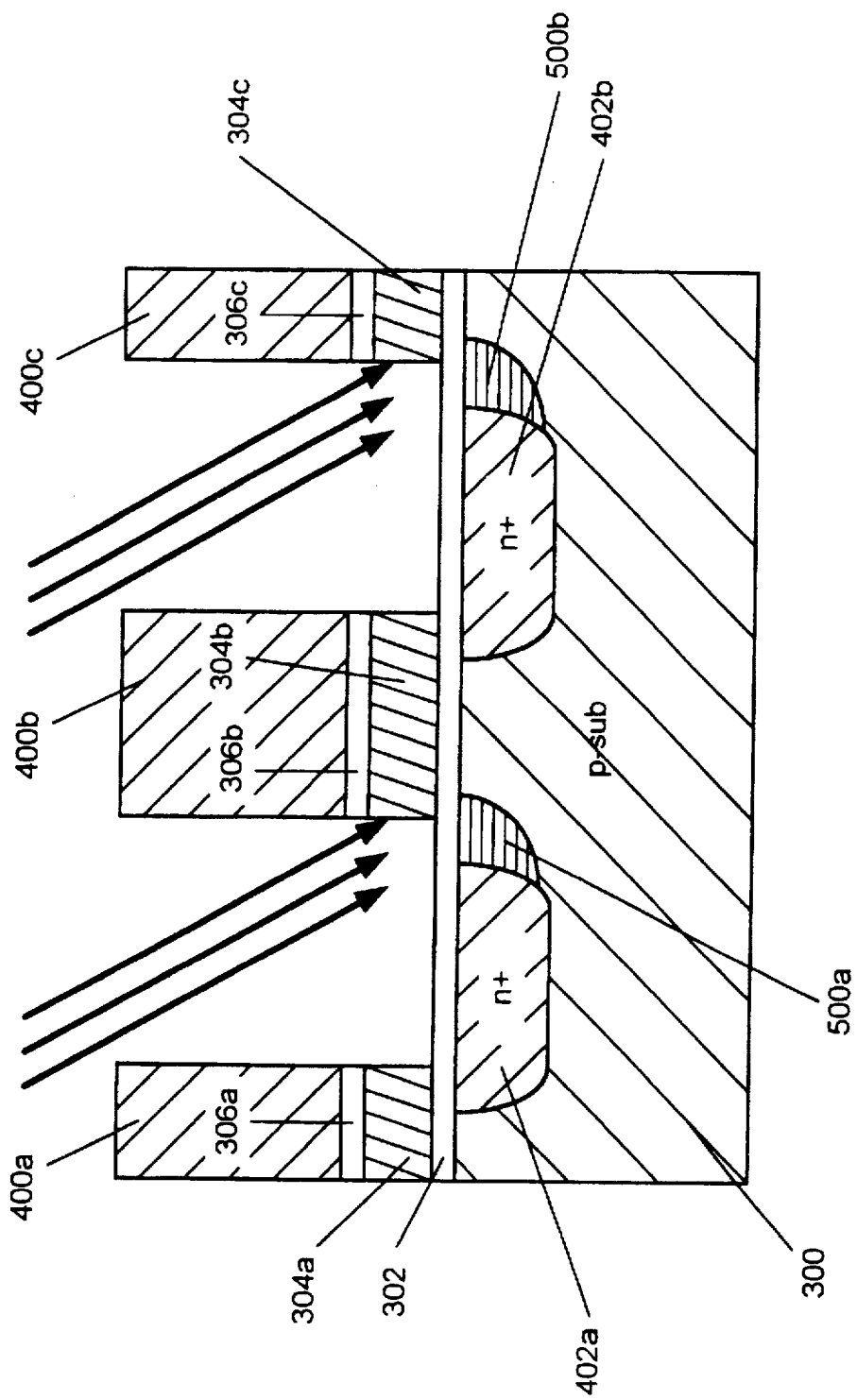

Next, as shown in FIG. 5, LATID implantation of $p^-$ pockets on the source sides of floating gate strips 304a–c, is shown. The boron ion is preferred for the $p^-$ implant. The angle of the implant depends on device geometry and may range from 30 to 75 degrees of tilt. The LATID implant produces buried $p^-$ pockets 500a–b between buried $n^+$ diffusions 402a–b and floating gate strips 304b–c, respectively. The dopant level of $p^-$ is about $10^{18}$ atom per cm$^3$. The pockets have dopant levels higher than the substrate and are used to concentrate the programming electric fields to enhance electron injection by either CHE or SSI mechanisms.

Figure 6:
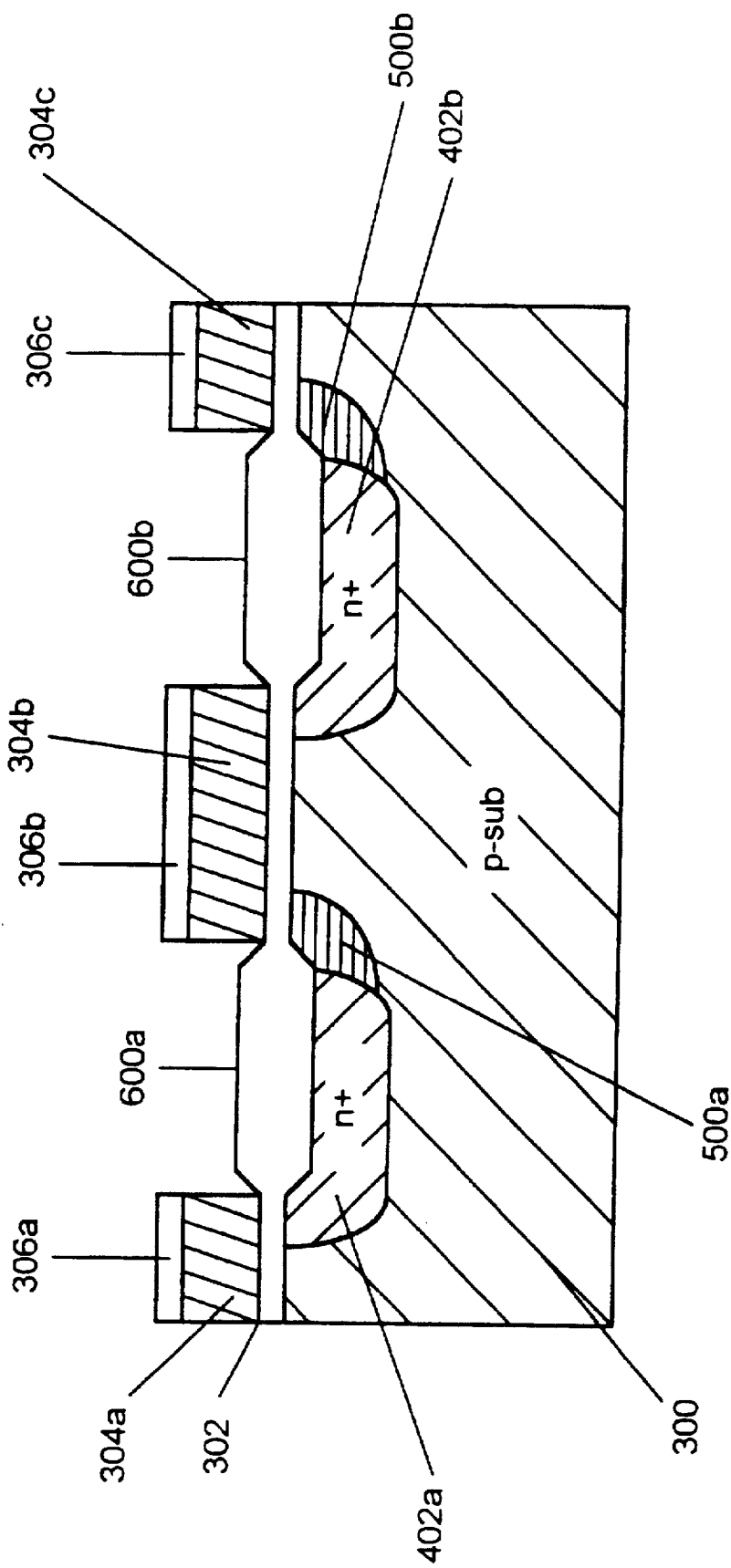

In FIG. 6, the photo-resist masks 400a–c have been removed. Then field oxide regions are grown over buried $n^+$ diffusions. As referenced in FIG. 6, field oxide regions 600a–b are grown over buried $n^+$ diffusions 402a–b, respectively.

Figure 7:
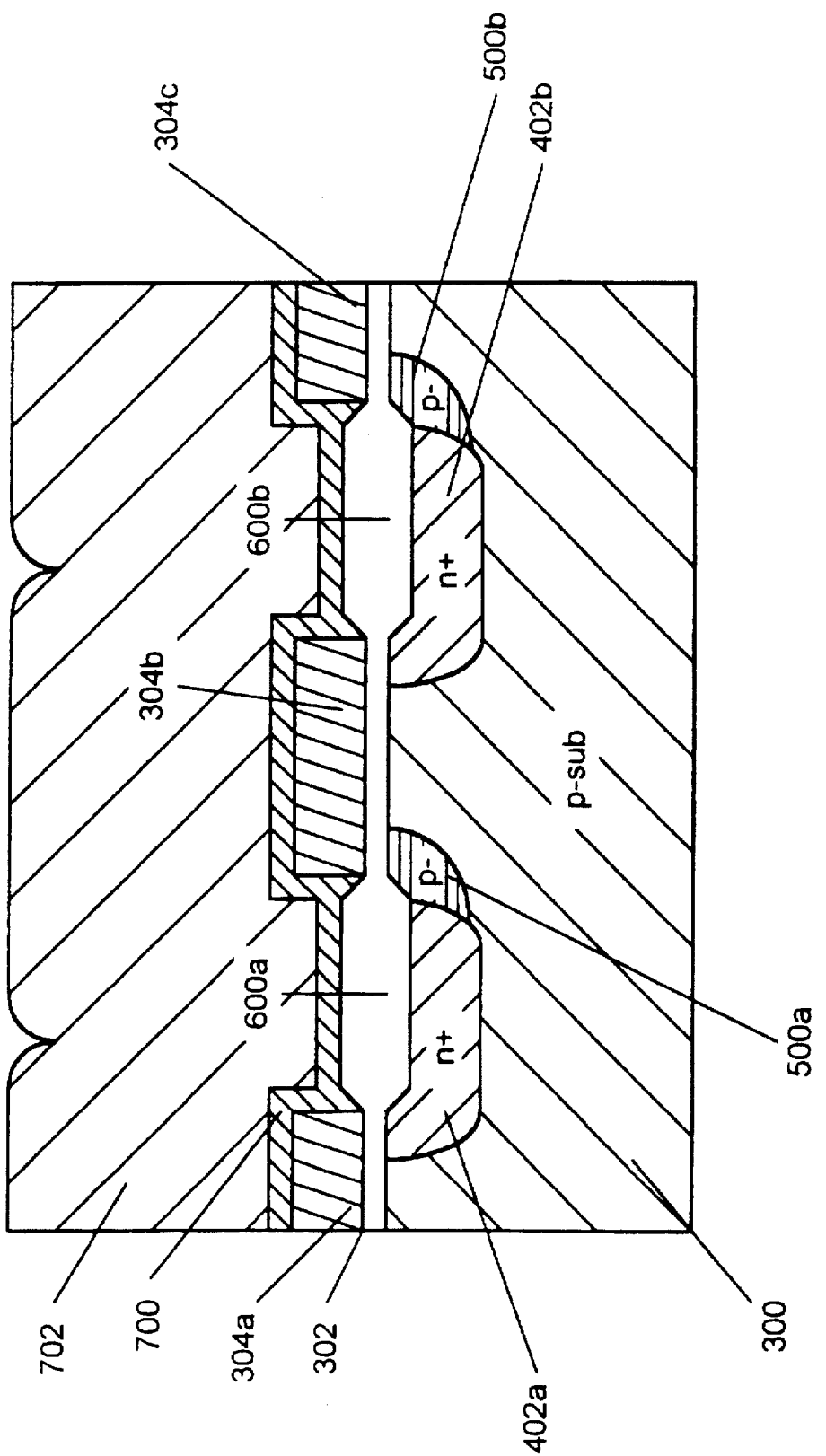

As shown in FIG. 7, the nitride caps 306a–c are removed. Conventionally, the next step would be to planarize by adding an oxide layer between the floating gate strips. This conventional planarization step is omitted. Instead an interpoly dielectric 700, e.g., oxide-nitride-oxide (ONO), is deposited on the non-planar surface formed by floating gate strips 304a–c and the field oxide regions 600a–b between the floating gate strips. Next, a polysilicon layer 702 is formed over the non-planar interpoly dielectric. The polysilicon layer is then pattered, masked and etched to form the word-lines of the memory array and to separate the floating gate strips into floating gates.

There are several advantages to omitting the oxide planarization step referred to above. For example, in the pattern, mask, and etch steps it is much easier to completely remove one material, i.e., polysilicon than a composite of two materials, i.e., polysilicon and oxide. Smaller device geometries are therefore possible. Furthermore, because of more complete material removal, device geometries can be favorably altered. The vertical dimension of the floating gate can be increased, with the result that the gate coupling ratio (GCR) is enhanced. The gate coupling ratio, correlates the amount of voltage that needs to be applied to the word-line/control-gate to produce a given voltage on the floating gate. The higher the GCR, the lower the word-line voltage required to produce a given floating gate voltage. Because the polysilicon layer, i.e., the word-line/control-gate wraps around the floating gate, an increase in the height of the floating gate translates to an increase in capacitative coupling between the word-line and the floating gate. This in turn, increases the GCR.

Figure 8:
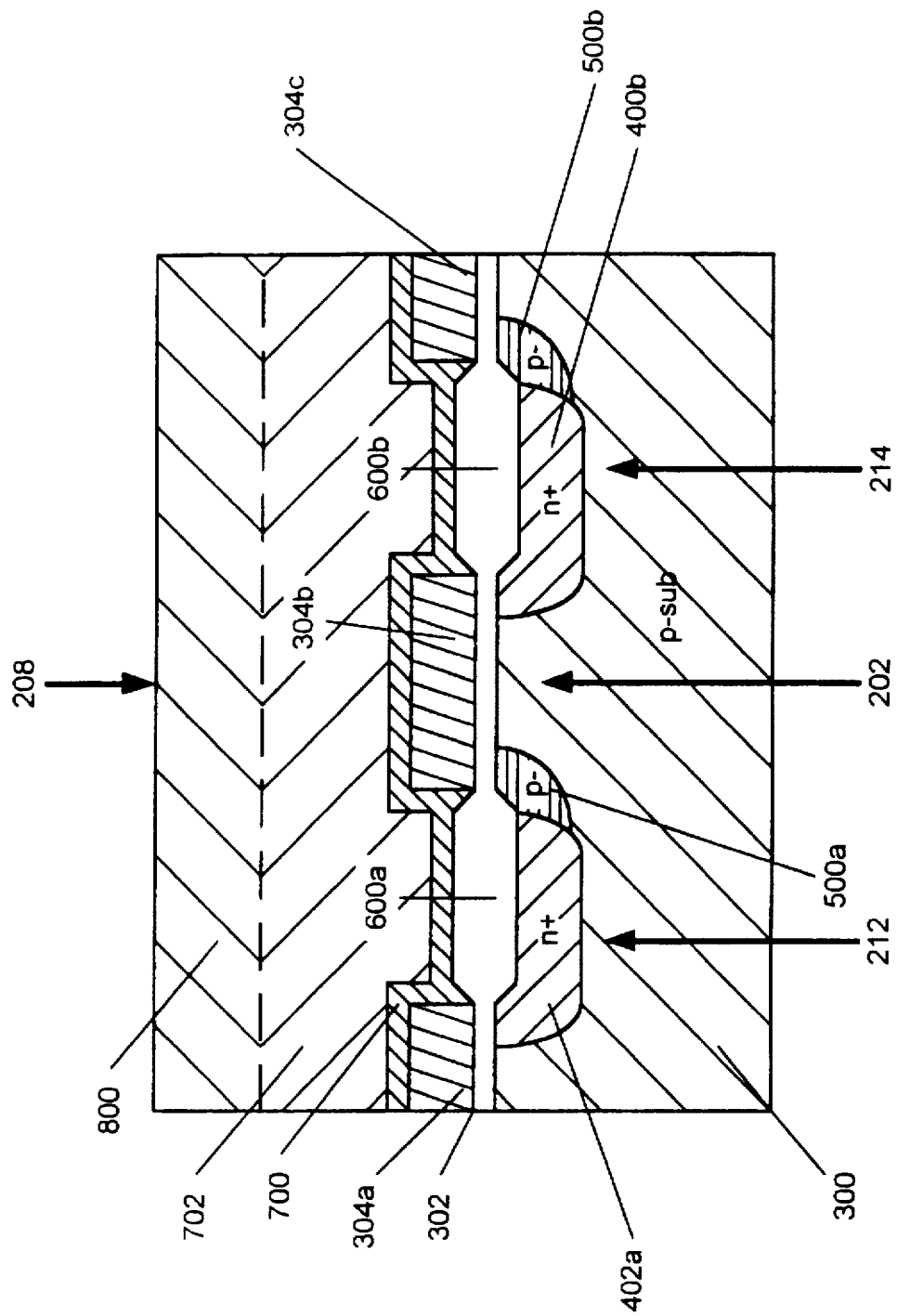

As shown in FIG. 8, the formation of the memory cells is completed. A silicide layer 800 of 1500–2000 Å is formed on polysilicon layer 702 after the polysilicon layer has been patterned, masked, and etched to form word-line 208, as shown in FIG. 2. The silicide layer improves the conductivity of the word-line. Buried $n^+$ diffusion 402a and $p^-$ pocket 500a are connected to appropriate circuitry to form buried virtual ground bit-line 212. Buried $n^+$ diffusion 402b and $p^-$ pocket 500b are connected to appropriate decoding circuitry to form buried virtual ground bit-line 214. Floating gate transistor 202, is thereby formed from control-gate/word-line 208, floating gate 304b and buried bit-lines 212 and 214.

As described above, according to the asymmetric transistor and manufacturing method therefor of this invention, memory cells can be fabricated with a high density, high programming speed and with reduced gate disturb.

The foregoing description of a preferred embodiment of the invention has been presented for purposes of illustration and description. It is not intended to limit the invention to the precise forms disclosed. Obviously, many modifications and equivalent arrangements will be apparent to practitioners skilled in this art. Therefore, persons of ordinary skill in this field are to understand that all such equivalent structures are to be included within the scope of the following claims and their legal equivalents.

What is claimed is:

1. A floating gate cell, comprising:

a semiconductor substrate characterized by a first conductivity type;

a dielectric provided on the semiconductor substrate;

a floating gate provided on the dielectric and comprising first and second opposing sides;

a first diffusion region in the semiconductor substrate on the first opposing side of the floating gate and characterized by a second conductivity type opposite the first conductivity type;

a second diffusion region in the semiconductor substrate adjacent the first diffusion region and extending under the floating gate and characterized by the first conductivity type;

a third diffusion region in the semiconductor substrate on the second opposing side of the floating gate and characterized by the second conductivity type.

2. The floating gate cell of claim 1, further comprising;

a control gate dielectric and control gates on the floating gate to provide a transistor.

3. The floating gate cell of claim 2, wherein;

said substrate is characterized by a p-type conductivity material;

said dielectric comprises silicon oxide;

said first diffusion region and said third diffusion region are characterized by an n-type conductivity material;

said second diffusion region is characterized by a p-type conductivity material having a greater concentration of p-type dopants than the substrate; and said floating gate comprises polysilicon.

4. A semiconductor memory array, comprising:

a semiconductor substrate characterized by a first conductivity type;

a dielectric on the semiconductor substrate;

an array of floating gates arranged as rows and columns and provided on the dielectric;

a plurality of first diffusion regions in the semiconductor substrate aligned on one side with a first column of said array of floating gates and extending to a second side displaced from a second column of said array of floating gates and said first diffusion regions characterized by a second conductivity type opposite said first conductivity type;

a plurality of second diffusion regions in the semiconductor substrate adjacent a corresponding one of said plurality of first diffusion regions extending under the second column of floating gates and each of the plurality of second diffusion regions characterized by an enhancement of the first conductivity type;

an isolation layer on the array of floating gates;

a plurality of word-line conductors connecting each of the rows of the array of floating gates, separated therefrom by the isolation layer, and forming a plurality of rows of floating gate transistors; and a plurality of select circuits electrically contacting the plurality of word-line conductors and the plurality of diffusion regions, wherein the plurality of select circuits selectively switch current to a word-line conductor and a selected pair of the first and second diffusion regions to program, erase, and read a selected floating gate transistor.

5. The semiconductor memory array of claim 4, wherein;

said substrate is characterized by an p-type conductivity material;

said dielectric comprises silicon oxide;

said plurality of first diffusion regions are characterized by an n-type conductivity material;

said plurality of second diffusion regions are characterized by a p-type conductivity material having a conductivity greater than the conductivity of the substrate; and said array of floating gates comprise polysilicon.

* * * * *